United States Patent
Yoneda et al.

(10) Patent No.: US 6,177,831 B1
(45) Date of Patent: *Jan. 23, 2001

(54) SEMICONDUCTOR INTEGRATED CIRCUIT WITH WELL POTENTIAL CONTROL CIRCUIT

(75) Inventors: Hirokazu Yoneda; Tetsuya Watanabe, both of Tokyo (JP)

(73) Assignee: Mitsubishi Denki Kabushiki Kaisha, Chiyoda-Ku, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/679,951

(22) Filed: Jul. 15, 1996

(30) Foreign Application Priority Data

Apr. 24, 1996 (JP) .................................... 8-102908

(51) Int. Cl.$^7$ ........................................ G05F 3/02
(52) U.S. Cl. ................................... 327/537; 327/543
(58) Field of Search ...................... 327/538, 537, 327/536, 535, 534, 530, 541, 543, 566

(56) References Cited

U.S. PATENT DOCUMENTS

| | | | |
|---|---|---|---|
| 4,454,571 | * | 6/1984 | Miyashita ............................ 327/530 |
| 4,503,339 | * | 3/1985 | Tsuge et al. ......................... 327/537 |
| 4,547,682 | * | 10/1985 | Bialas, Jr. et al. ................... 327/536 |
| 5,003,197 | * | 3/1991 | Nojima et al. ....................... 327/536 |
| 5,081,371 | * | 1/1992 | Wong .................................. 327/536 |
| 5,099,146 | * | 3/1992 | Miki et al. ........................... 327/537 |
| 5,172,013 | * | 12/1992 | Matsumura .......................... 327/536 |
| 5,202,587 | * | 4/1993 | McLaury ............................. 327/536 |
| 5,227,675 | * | 7/1993 | Taguchi ............................... 327/530 |
| 5,243,228 | * | 9/1993 | Maruyama et al. ................. 327/534 |
| 5,397,934 | * | 3/1995 | Merrill et al. ....................... 327/537 |
| 5,442,307 | * | 8/1995 | Shigehara et al. .................. 327/537 |
| 5,521,546 | * | 5/1996 | Kim .................................... 327/535 |
| 5,557,231 | * | 9/1996 | Yamaguchi et al. ................ 327/537 |
| 5,610,533 | * | 3/1997 | Arimoto et al. ..................... 326/33 |
| 5,612,643 | * | 3/1997 | Hirayama ............................ 327/534 |
| 5,612,644 | * | 3/1997 | Runas ................................. 327/535 |
| 5,917,365 | * | 6/1999 | Houston .............................. 327/537 |

OTHER PUBLICATIONS

Katsuhiro Seta et al., "50% Active–Power Saving without Speed Degradation using Standby Power Reduction (SPR) Circuit," FP 19.4, p. 318–319, 1995 IEEE ISSCC Digest of Technical Papers.

* cited by examiner

Primary Examiner—Timothy P. Callahan
Assistant Examiner—Terry L. Englund
(74) Attorney, Agent, or Firm—Burns, Doane, Swecker & Mathis, LLP

(57) ABSTRACT

A semiconductor integrated circuit which effects the subtle control of the well or substrate potential of a circuit in accordance with the operating frequency, the signal multiplication rate from a PLL circuit, the source voltage or the operating state of the circuit, thereby adjusting the operating speed of the circuit and reducing the consumption of electricity.

13 Claims, 19 Drawing Sheets

FIG. 1A
PRIOR ART
FIG. 1B
PRIOR ART
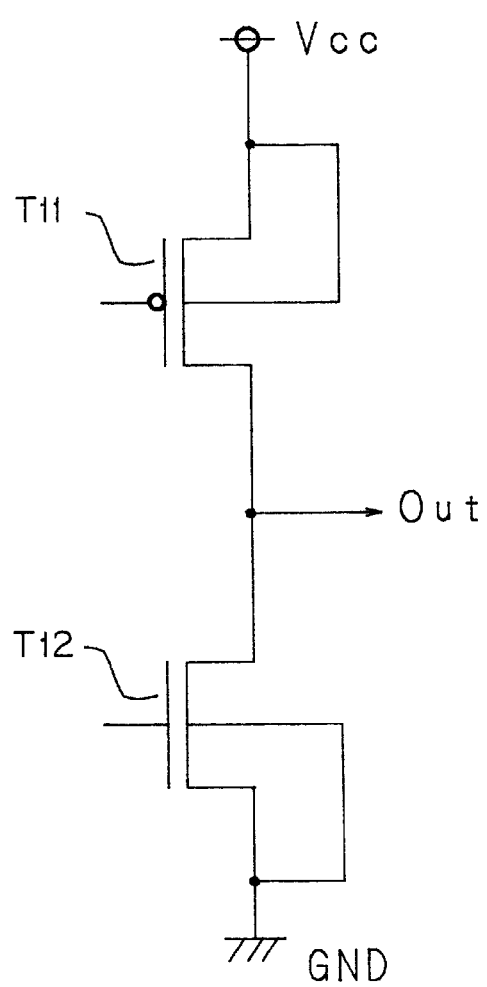
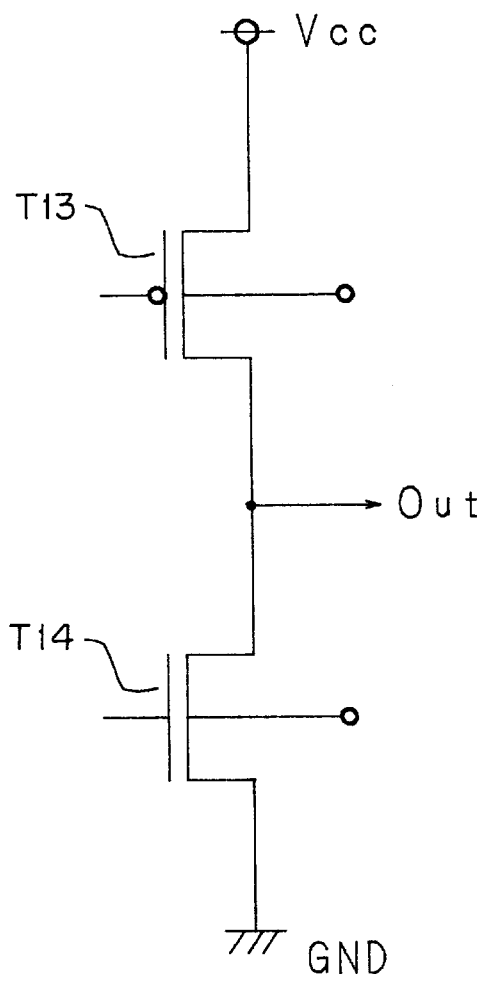

FIG. 5A
FIG. 5B
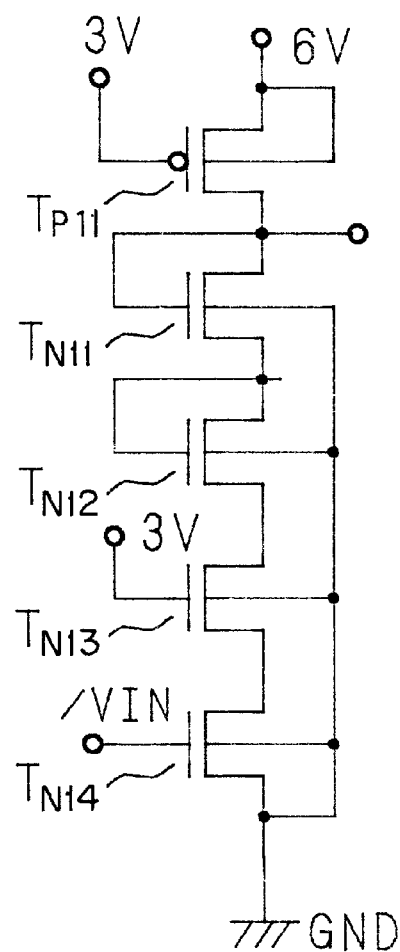
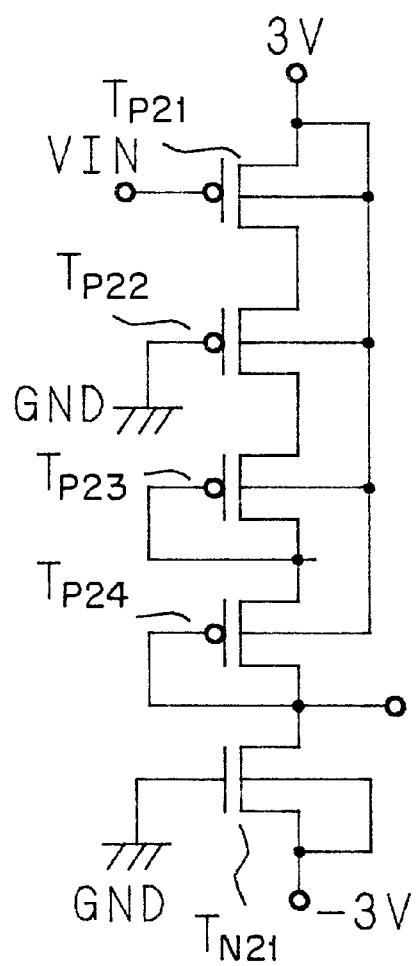

SEMICONDUCTOR INTEGRATED CIRCUIT WITH WELL POTENTIAL CONTROL CIRCUIT

BACKGROUND OF THE INVENTION

1. Field of the Invention

The present invention relates to a semiconductor integrated circuit which allows the adjustment of the operating speed of a circuit or a semiconductor device constituting the circuit and the adjustment of the consumption of electricity, wherein the circuit includes one or more circuits, such as MOSIC (Metal Oxide Semiconductor Integrated Circuit).

2. Description of Related Art

FIGS. 1A and 1B is a circuit diagram of a known inverter using a P-channel MOS transistor and an N-channel MOS transistor both in which a well potential (or substrate potential) is predetermined. The reference numerals T11 and T13 designate the P-channel MOS transistors and the reference numerals T12 and T14 designate the N-channel MOS transistors, respectively. There are two sets of series connected transistors: T11 with T12 and T13 with T14. T11 and T13 connected in series T12 and T14 are connection in series, and the junctions therebetween is connected to an output terminal Out.

The source of the P-channel MOS transistor T11 is delivered with a source voltage Vcc, and the source of the N-channel MOS transistor T12 is grounded, and the gate of each transistor T11 aid T12 is connected to a voltage source of signals (not shown) in FIG. 1A.

The N-well of the P-channel MOS transistor T11 shown in FIG. 1A is delivered with a source voltage Vcc as the source thereof is, and the P-well of the N-channel MOS transistor T12 is at the ground potential as the source thereof is. These potentials are predetermined.

The N-well of the P-channel MOS transistor T13 and the P-channel of the N-channel MOS transistor T14 shown in FIG. 1B are also at a predetermined potential.

There is also known a MOSIC designed to change a threshold voltage of a transistor in accordance with the operating conditions of the circuit which is disclosed in "ISSCC 95, Feb. 17, 1995, p. 318–319/FP19.4 (50% Active Power Saving without Speed Degradation Using Standby Power Reduction (SPR) Circuit)".

In this MOSIC the well potential is selectively switched over between two bits depending upon the circuit being in operation or not in operation.

In general, when the potential of a well or substrate is predetermined in a transistor constituting the MOSIC, the threshold voltage of the transistor is automatically fixed, thereby leaving no room for controlling the operating speed of the circuit or transistor and the consumption of electricity.

In the case of an expedient for varying the well potential by two stages, it is difficult to effect the subtle control of the operating speed and consumption of electricity.

There are MOSICs which include a circuit capable of predetermining an operating frequency as desired or a circuit operable at a plurality of source voltages. In neither case the well potential or substrate potential can be varied in accordance with the operating frequency or source voltage. As a result, the following problems arise:

In the former case, a variation in the operating frequency changes a time required for completing a predetermined operation of the circuit; for example, when a circuit in the MOSIC is operated at a high frequency, the transistor constituting the circuit is required to operate at a high speed, whereas if it is operated at a low frequency, the transistor may be operated at a low speed. When the circuit is designed to operate at a high frequency, the transistor must be unnecessarily operated at a high speed.

In the latter case, when the circuit is used at a high source voltage, the transistor is operated at a high speed, and the consumption of electricity becomes large. In contrast, when the circuit is used at a low source voltage, the consumption of electricity is reduced but the disadvantage is that the operating speed of the transistor becomes low.

SUMMARY OF THE INVENTION

The present invention has been made to solve the problems mentioned above, and an object of the present invention is to provide a semiconductor integrated circuit capable of effecting the subtle control of the operating speed of a transistor and reducing the consumption of electricity by controlling the potential of a well or substrate.

The semiconductor integrated circuit of a first invention comprises at least one circuit including a well/substrate, and a potential control circuit for changing the potential of the well/substrate, thereby controlling the well/substrate potential.

As a result, the operating speed of the circuit or semiconductor devices and the consumption of electricity can be subtly adjusted by controlling the well potential or substrate potential with changing thereof continuously or separately.

The semiconductor integrated circuit of a second invention comprises, according to the first invention, the potential control circuit which receives a predetermined frequency and controls the well/substrate potential in accordance with the applied frequency.

As a result, the operating speed of the circuit or semiconductor devices and the consumption of electricity can be subtly adjusted by controlling the well potential or substrate potential in accordance with the operating frequency.

The semiconductor integrated circuit of a third invention comprises, according to the first invention, the potential control circuit which receives a signal multiplication rate outputted from a PLL circuit and controls the well/substrate potential in accordance with the applied signal multiplication rate.

As a result, the operating speed of the circuit or semiconductor devices and the consumption of electricity can be subtly adjusted by controlling the well potential or substrate potential in accordance with the applied signal multiplication rate.

The semiconductor integrated circuit of a fourth invention comprises, according to the first invention, the potential control circuit which receives a predetermined source voltage, and controls the well/substrate potential in accordance with the applied source voltage.

As a result, the operating speed of the circuit or semiconductor devices and the consumption of electricity can be subtly adjusted by controlling the well potential or substrate potential in accordance with a variable source voltage.

The semiconductor integrated circuit of a fifth invention additionally comprises, according to the first invention, an identification circuit for identifying the operating conditions of the circuit, and wherein the potential control circuit controls the well/substrate in accordance with an identification signal from the identification circuit.

As a result, the operating speed of the circuit or semiconductor devices and the consumption of electricity can be subtly adjusted by controlling the well potential or substrate potential in accordance with an identification signal from the identification circuit.

The semiconductor integrated circuit of a sixth invention additionally comprises, according to the first invention, an input terminal for receiving an external signal, and wherein the potential control circuit controls the well/substrate potential in accordance with a voltage applied to the input terminal.

As a result, the operating speed of the circuit or semiconductor devices and the consumption of electricity can be subtly adjusted by controlling the well potential or substrate potential in accordance with a voltage applied to the input terminal.

The semiconductor integrated circuit of a seventh invention comprises, according to the first invention, the potential control circuit which includes an output terminal for controlling a well/substrate potential in an external MOSIC.

As a result, the potential control circuit can control the potential of a well or substrate in an external MOSIC, thereby ensuring that the operating speed of the circuits or semiconductor devices in a wide range and the consumption of electricity can be subtly adjusted.

The above and further objects and features of the invention will more fully be apparent from the following detailed description with the accompanying drawings.

BRIEF DESCRIPTION OF THE DRAWINGS

FIGS. 1A and 1B is a circuit diagram of an inverter using a known P-channel MOS transistor and N-channel MOS transistor;

FIGS. 5A and 5B are a circuit diagram illustrating a structure of the potential control division shown in FIG. 2;

DESCRIPTION OF THE PREFERRED EMBODIMENTS

Figure 2:
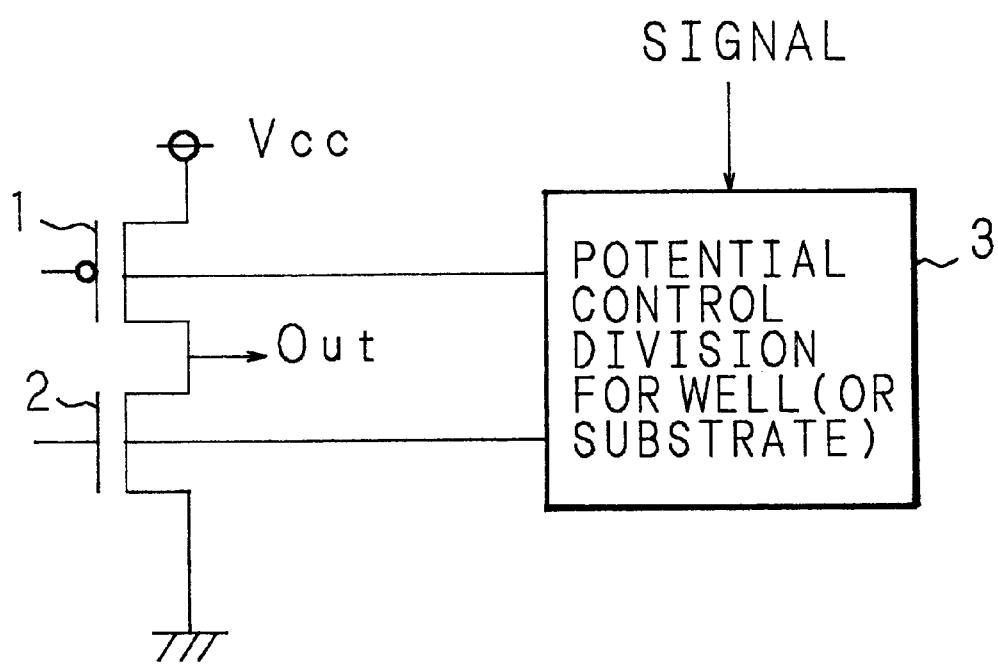
FIG. 2 is a block diagram illustrating the principle underlying the present invention.

The present invention will be described in greater detail by way of example by reference to the accompanying drawings:

The principle underlying the present invention will be described by reference to FIGS. 2 through 4:

FIG. 2 is a block diagram illustrating the principle underlying the present invention, wherein the reference numerals 1, 2 and 3 designate a P-channel MOS transistor constituting a circuit to be controlled in a MOSIC, an N-channel MOS transistor, and a potential control division for controlling a well potential or a substrate potential of the P-channel MOS transistor 1 and N-channel MOS transistor 2, respectively.

The P-channel MOS transistor 1 and N-channel MOS transistor 2 are connected in series, and the junction thereof is connected to an output terminal Out. The source of the P-channel MOS transistor 1 is at a source potential Vcc, and the source of N-channel MOS transistor 2 is at the ground potential. Each gate thereof is connected to a control signal line (not shown). The well or substrate of the P-channel MOS transistor 1 and N-channel MOS transistor 2 are respectively connected to the potential control division 3.

In response to a predetermined signal received from inside or outside the MOSIC, the potential control division 3 continuously or discontinuously controls the well and/or substrate potential of the P-channel MOS transistor 1 and/or the N-channel MOS transistor 2.

Figure 3:
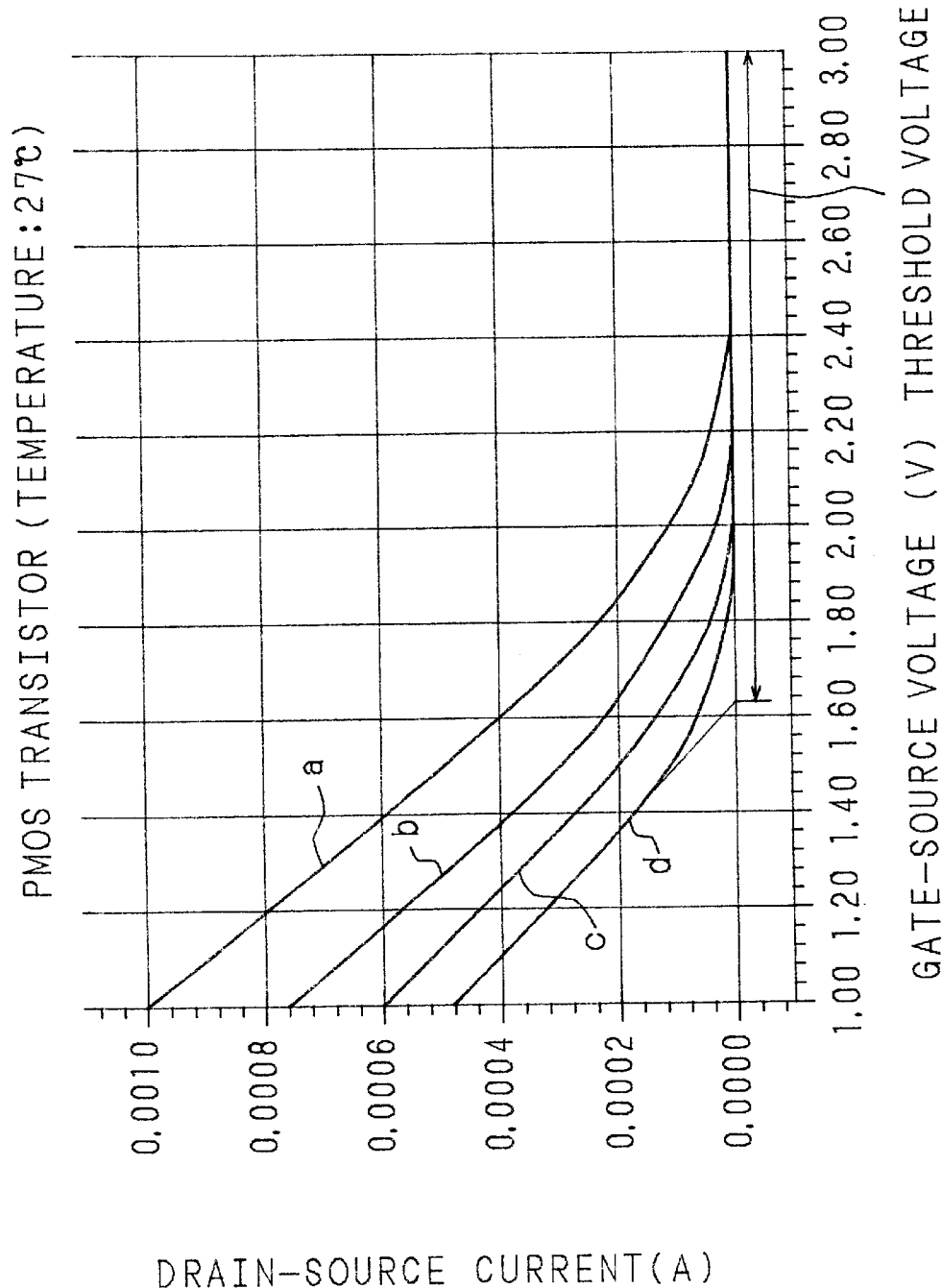
FIG. 3 is a graph illustrating the dependency of a threshold voltage on the N-well potential in the P-channel MOS transistor in common use.
Figure 4:
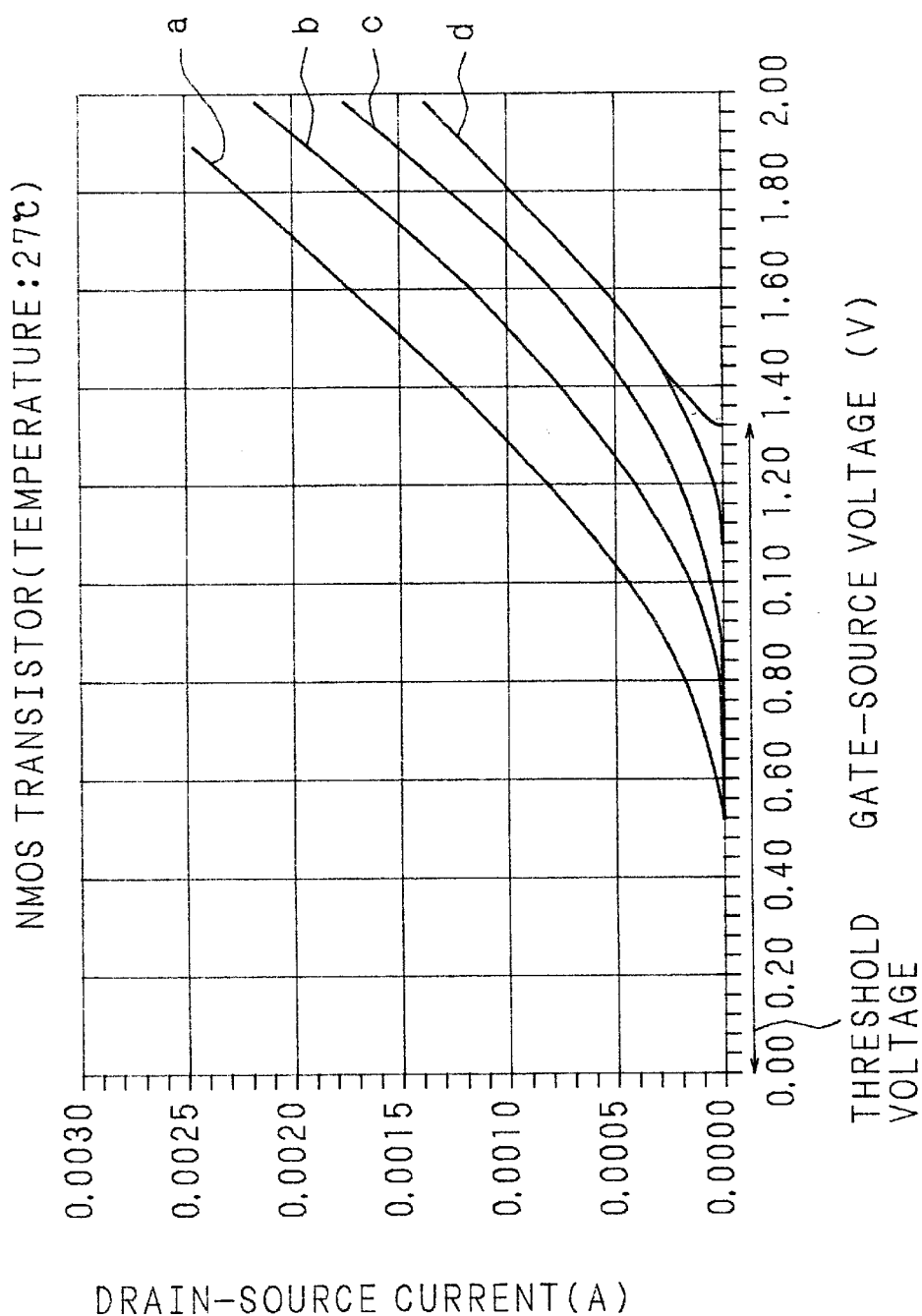
FIG. 4 is a graph showing the dependency of a threshold voltage on the P-well potential in the N-channel MOS transistor in common use.

FIG. 3 is a graph illustrating the potential dependency of a threshold voltage on the N-well potential in the P-channel MOS transistor (as a result of inspection conducted at 27° C.), and FIG. 4 is a graph illustrating the potential dependency of a threshold voltage on the P-well potential in the N-channel MOS transistor (as a result of inspection conducted at 27° C.).

The curves a through d in the graph of FIG. 3 indicate the results obtained when the well potentials are set to 3.0V, 4.0V, 5.0V and 6.0V.

It will be understood from FIG. 3 that in the P-channel MOS transistor the rise in the N-well potential causes the absolute value of the threshold voltage to rise and the drain-source current to diminish.

The curves a through d in the graph of FIG. 4 indicate the results obtained when the well potentials are set to 0.0V, −1.0V, −2.0V and −3.0V.

It will be understood from FIG. 4 that in the N-channel MOS transistor the drop in the P-well potential causes the threshold voltage of the transistor to rise and the drain-source current to diminish.

It is known that a particular relationship between the threshold voltage Vt and the drain-source current Ids exists; namely, in the linear domain of the transistor the following equation (1) is established:

$$Ids \{2(Vgs-Vt)-Vds\} \times Vds \qquad (1)$$

where Vgs: gate-source voltage, and

Vds: drain-source voltage.

In the saturation domain of the transistor the following equation (2) is established:

$$Ids \propto (Vgs-Vt)^2 \qquad (2)$$

The relationship between the threshold voltage Vt and the substrate potential is expressed by the following equation (3):

$$Vt=Vt_0+\gamma\{\sqrt{(|2\phi f|+|Vsb|)}-\sqrt{(|2\phi f|)}\} \qquad (3)$$

where $Vt_0$: threshold voltage at Vgs=0;

γ: substrate threshold voltage coefficient;

φf: Fermi level; and

Vsb: voltage between source and well (or source and substrate).

As is evident from the equations (1) to (3), the rise in the absolute value of the threshold voltage of the transistor causes the current flowing between the drain and source to decrease. The decrease in the current prolongs a period of time required for charging and discharging because of the fixed capacity of the node at which the transistor is charged or discharged, thereby slowing down the operating speed of the circuit.

The decrease in the absolute value of the threshold voltage of the transistor causes the current to increase, thereby speeding up the operation of the circuit.

Each of the above-mentioned the first through the seventh invention and the following embodiments is constructed on the utilization of the above-mentioned fundamental principle.

Each embodiment will be more particularly described:
Embodiment 1

The potential control division 3 shown in FIG. 2 is constructed as shown in FIGS. 5A and 5B so as to control the well potential (or substrate potential) of the P-channel MOS transistor 1 and the N-channel MOS transistor 2 respectively.

FIGS. 5A and 5B are circuit diagrams illustrating a specified structure of the potential control division 3 shown in FIG. 2, wherein FIG. 5A shows a potential control circuit for the well of the P-channel MOS transistor 1, and FIG. 5B shows a potential control circuit for the well of the N-channel MOS transistor 2.

The N-well potential control circuit shown in FIG. 5A includes one P-channel MOS transistor Tp11 and four N-channel MOS transistors Tn11, through Tn14, connected in series, and the gate of the P-channel MOS transistor Tp11 is delivered with a constant source voltage (3V), and the source and well are respectively delivered with a constant source voltage (6V). The gate of the N-channel MOS transistor Tn11 is connected to the N-well of the P-channel MOS transistor 1 shown in FIG. 2.

The gate of the N-channel MOS transistor Tn12, is connected to the source-drain junction of the N-channel MOS transistor Tn11 and Tn12, and the gate of the N-channel MOS transistor Tn13 is delivered with a constant source voltage (3V). The gate of the N-channel MOS transistor Tn14 is delivered with a reversing signal/VIN (3V; variable source voltage value) of a signal VIN, and the source thereof is kept at a ground potential as is the wells of the N-channel MOS transistors Tn11 through Tn14.

As shown in FIG. 5B, the P-well potential control circuit includes four P-channel MOS transistors Tp21 through Tp24 and one N-channel MOS transistor Tn21 connected in series.

The gate of the P-channel MOS transistor Tp21 is delivered with a variable source voltage VIN, and the source and well thereof is delivered with a constant source voltage (3V).

The gate of the P-channel MOS transistor Tp22 is delivered with a ground voltage, and the gate of the P-channel MOS transistor Tp23 is connected to a source-drain junction of the P-channel MOS transistors Tp23 and Tp24. The gate of the P-channel MOS transistor Tp24 is connected to the P-well of the N-channel MOS transistor 2 shown in FIG. 2.

The gate of the N-channel MOS transistor Tn21 is at a ground potential, and the source and well thereof are delivered with a constant source voltage (−3V).

Figure 6:
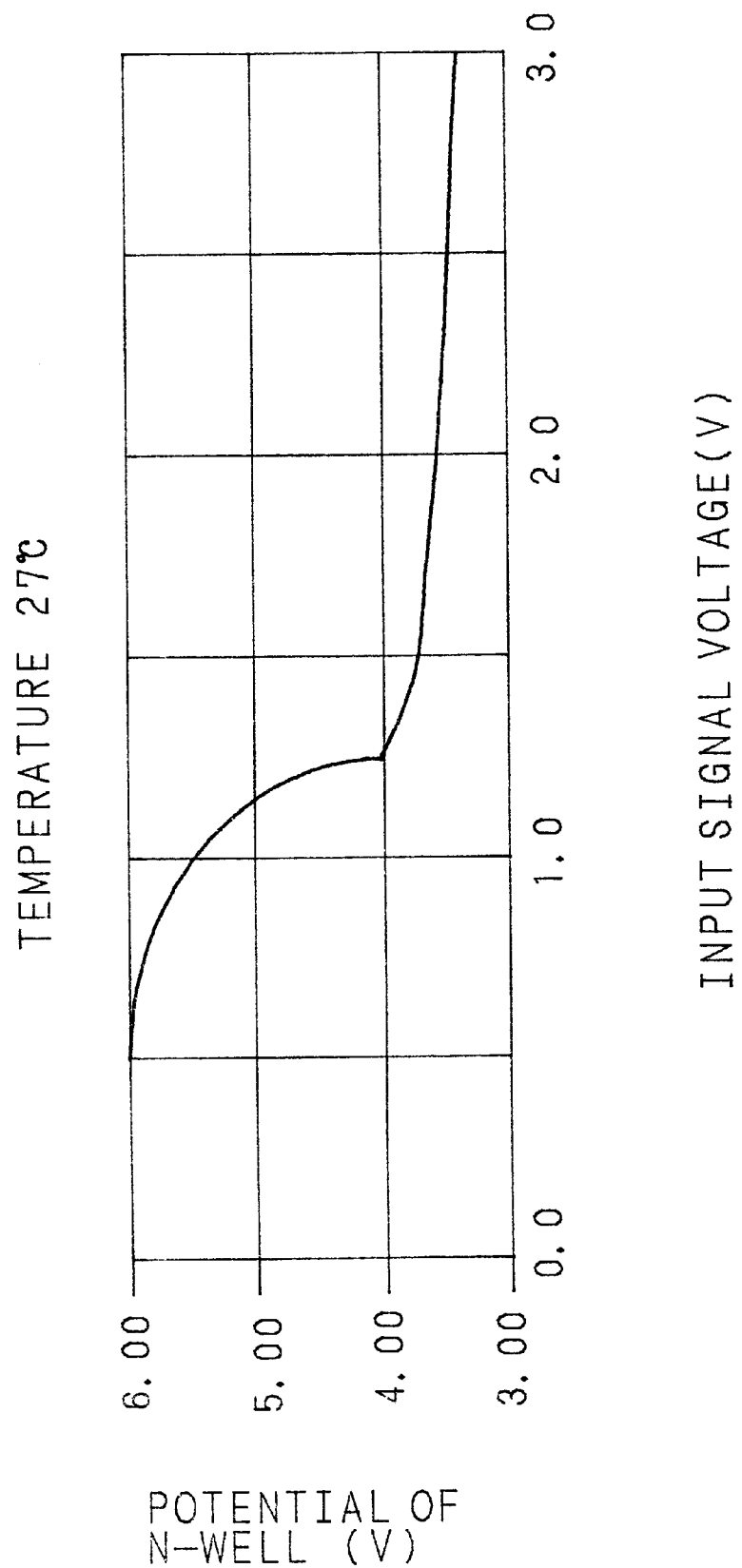
FIG. 6 is a graph showing the operating characteristics of the circuit shown in FIG. 5B.

FIG. 6 is a graph showing the operating characteristics of the potential control circuit shown in FIG. 5A at 27° C. wherein the x-axis represents input signal voltages (V) from a variable voltage source (not shown) and the y-axis represents the potentials of the N-well of the P-channel MOS transistor 1 shown in FIG. 2. The graph clearly indicates that when the input signal voltage (V) is amplified from 0 to 1.25, the potential of the N-well abruptly drops from 6.00 (V) to 4.00 (V), and thereafter gradually decreases with an increase in the input signal voltage (V).

In this way, when the voltage supplied from the variable source voltage (namely, the input signal voltage) is increased, the N-well potential of the p-channel MOS transistor 1 decreases, thereby increasing the operating speed of the circuit.

Figure 7:
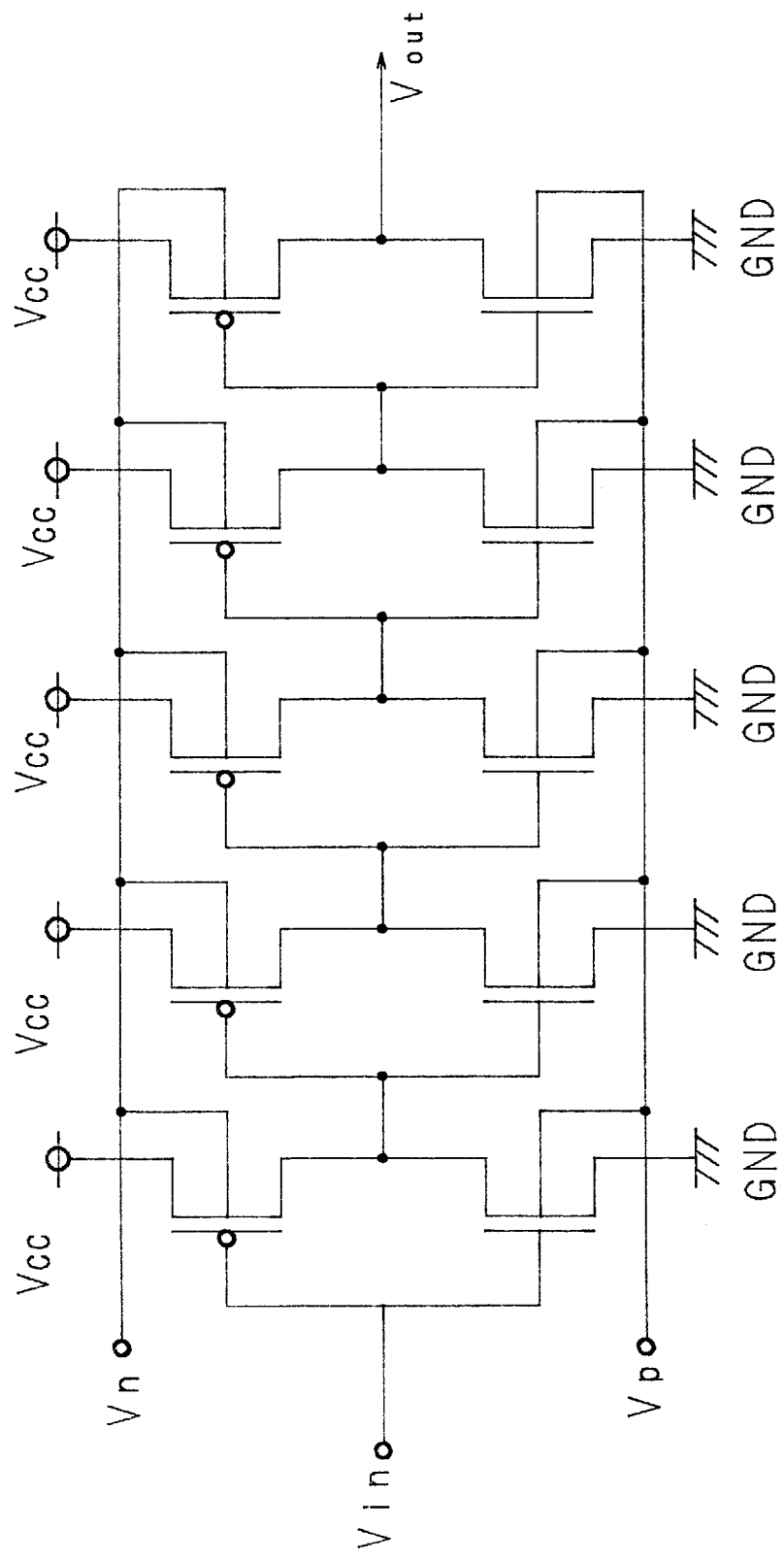
FIG. 7 is a circuit diagram illustrating a 5-stage inverter constituting a semiconductor integrated circuit device used as an simulation for ascertaining the operation and effects of Embodiment 1.

FIG. 7 is a circuit diagram showing a 5-stage inverter system constituting a semiconductor integrated circuit device used as an simulation for ascertaining the operation and effects of Embodiment 1.

Five series circuits are arranged in parallel in stage each of which includes the P-channel NIOS transistor and N-channel MOS transistor connected in series. The source of each P-channel MOS transistor is delivered with a source voltage Vcc, and the source of each N-channel MOS transistor is delivered with a ground voltage GND. The gate of the P-channel MOS transistor and N-channel MOS transistor at each stage is connected to a junction between the drain of the P-channel MOS transistor and the drain of the N-channel MOS transistor at the preceding stage.

The N-well of the P-channel MOS transistor at each stage is at a potential Vn in the potential control division 3 shown in FIG. 2, and the P-well of each N-channel MOS transistor is kept at a potential Vp in the same.

The gates of the P-channel MOS transistor and N-channel MOS transistor at the 1st stage are connected to an input terminal Vin, and those at the 5th stage are connected to an output terminal of the 4th stage.

Figure 8:
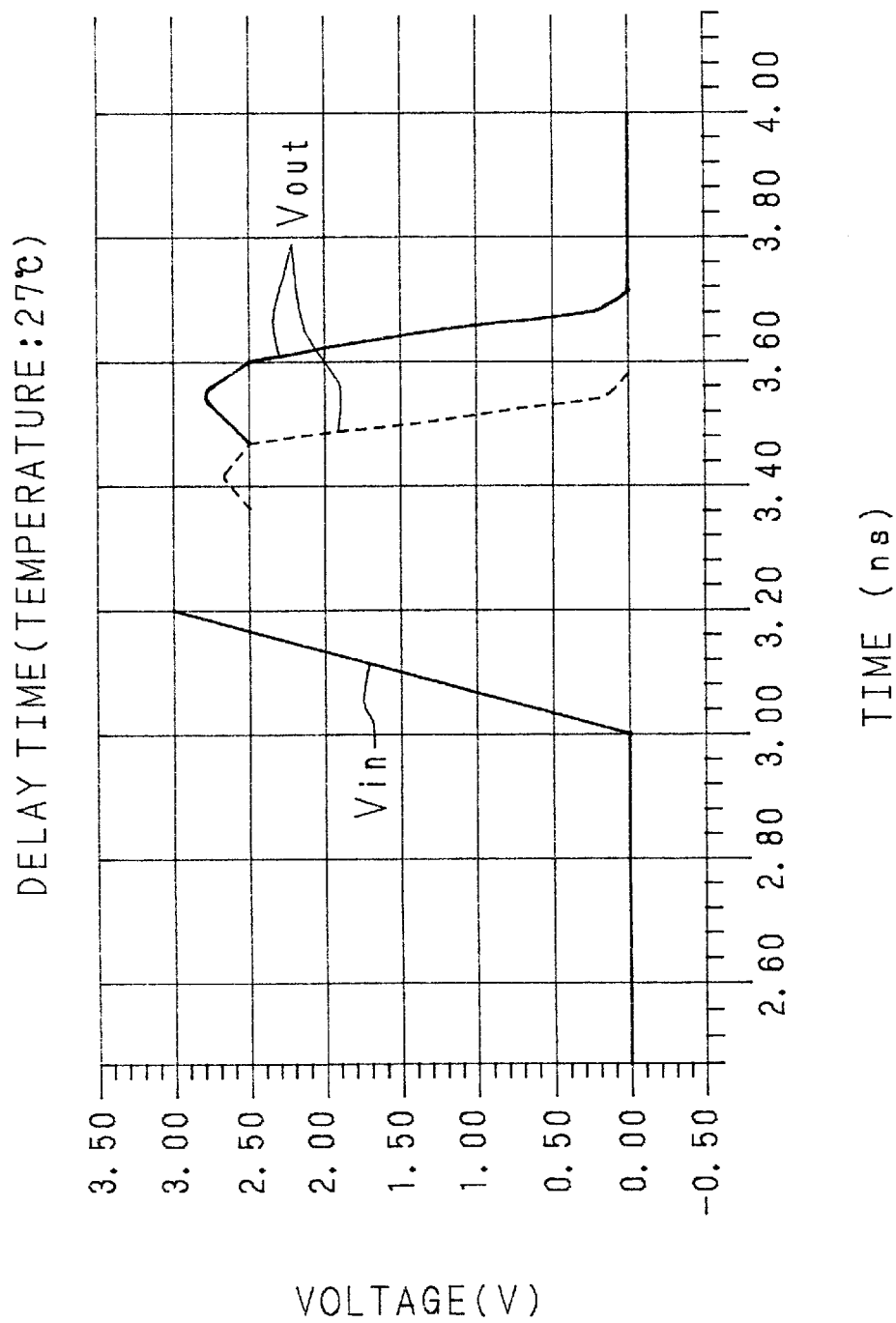
FIG. 8 is a graph showing the results of simulation obtained from the circuit shown in FIG. 7.
Figure 9:
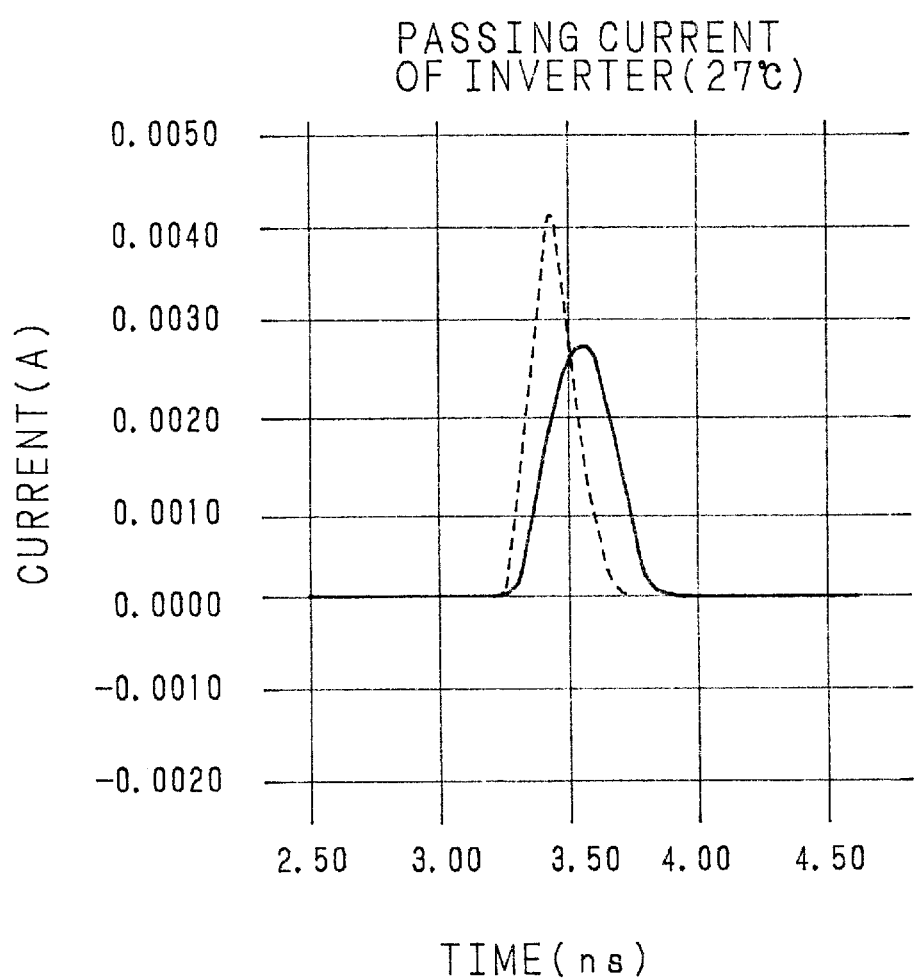
FIG. 9 is a graph showing the results of simulation obtained from the circuit shown in FIG. 7.

FIGS. 8 and 9 are graphs showing the results of simulation obtained at 27° C. FIG. 8 shows speeds at which the transistor is operated by changing the N-well potential where the x-axis represents time (ns) and the y-axis represents voltage (V). The solid line shows the output waveform of the output terminal Vout obtained when the N-well potential is 6.0V, and the P-well potential is −3.0V, and the dotted line shows the output waveform of the output terminal Vout obtained when the N-well potential is 3.0V, and the P-well potential is 0.0V.

It will be understood from FIG. 8 that the adjustment of the N-well and P-well potential causes an increase or a decrease in the operating speeds of the transistor.

FIG. 9 shows the results of simulation of passing a current through the inverter at 27° C. wherein the x-axis represents time (ns) and the y-axis represents a passing current (A). The solid line shows the passing current of the inverter when the N-well potential is 6.0V and the P-well potential is −3.0V, and the dotted line shows the passing current of the inverter obtained when the N-well potential is 3.0V and the P-well potential is 0.0V.

It will be understood from FIG. 9 that the adjustment of the well potentials varies the absolute value of the threshold voltage, thereby increasing or decreasing the passing current of the inverter, and adjusting the consumption of electricity.

Embodiment 2

This embodiment is especially applicable to a MOSIC capable of operating at a plurality of clock frequencies, and can adjust the operating speed of the transistors in the MOSIC and the consumption of electricity. For example, when a high clock frequency is used, a high speed operation is required for each transistor. However, when the same MOSIC circuit is operated at a low frequency, the transistor is operated at an unnecessarily higher speed beyond the clock cycle, thereby wasting electricity.

Figure 10:
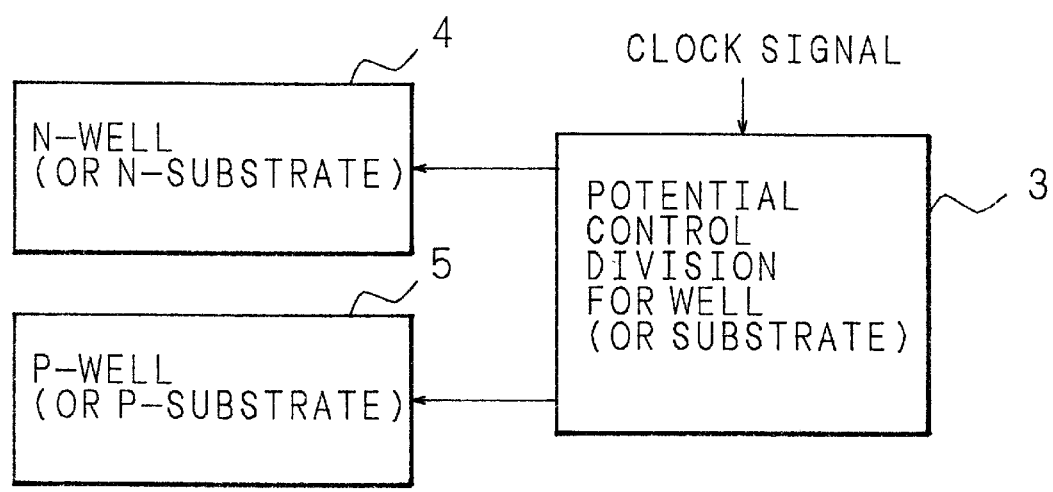
FIG. 10 is a block diagram illustrating the structure of Embodiment 2.

FIG. 10 is a block diagram illustrating the structure of Embodiment 2 wherein the reference numerals 4 and 5 designate the N-well (or N type substrate) of the P-channel MOS transistor, and the P-well (or P type substrate) of the N-channel MOS transistor, respectively. The potential control division 3 is fed with a clock signal which is an operating clock of the MOSIC, and the potentials of the N-well 4 and P-well 5 are controlled in the potential control division 3 in accordance with the frequencies of the clock signal.

Figure 11:
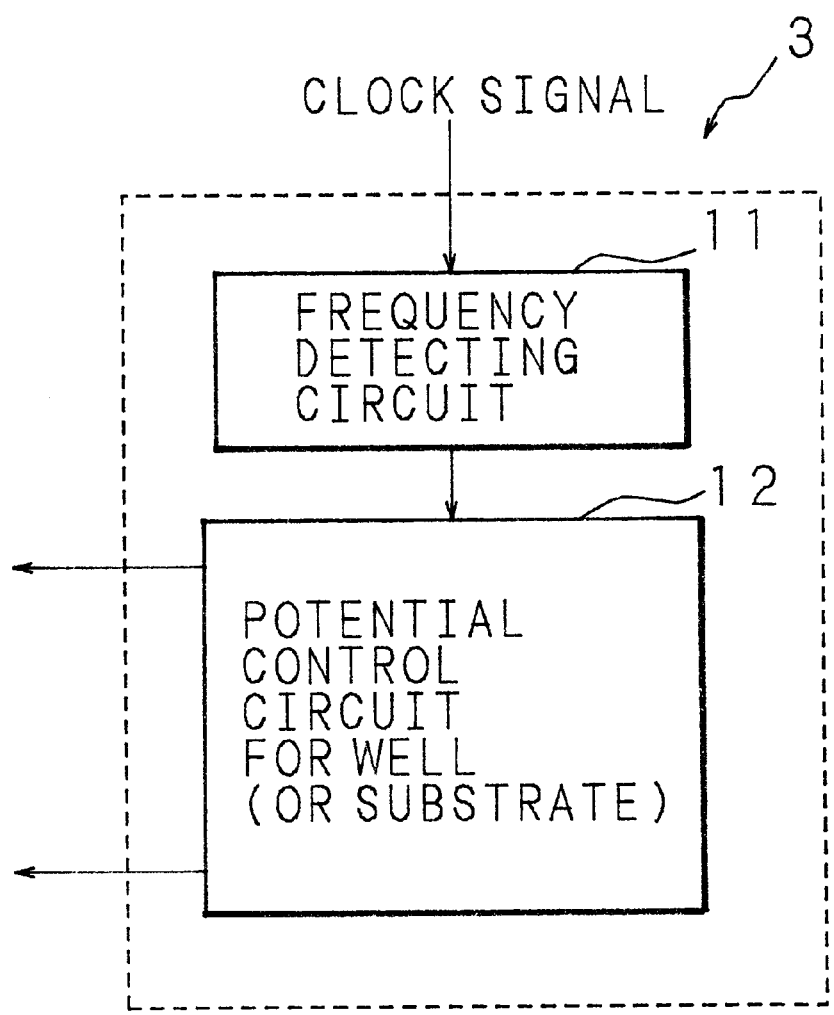
FIG. 11 is a block diagram illustrating the structure of the potential control division shown in FIG. 10.

FIG. 11 is a block diagram illustrating the structure of the potential control division 3 shown in FIG. 10, and the potential control division 3 includes a frequency detecting circuit 11 and a potential control circuit 12 for controlling the potential of the well (or the substrate). The clock signal is inputted to the frequency detecting circuit 11 where the frequency thereof is detected. Then the clock frequency is inputted to the potential control circuit 12 which controls the potentials of the N-well and P-well in accordance with the clock cycle.

Figure 12:
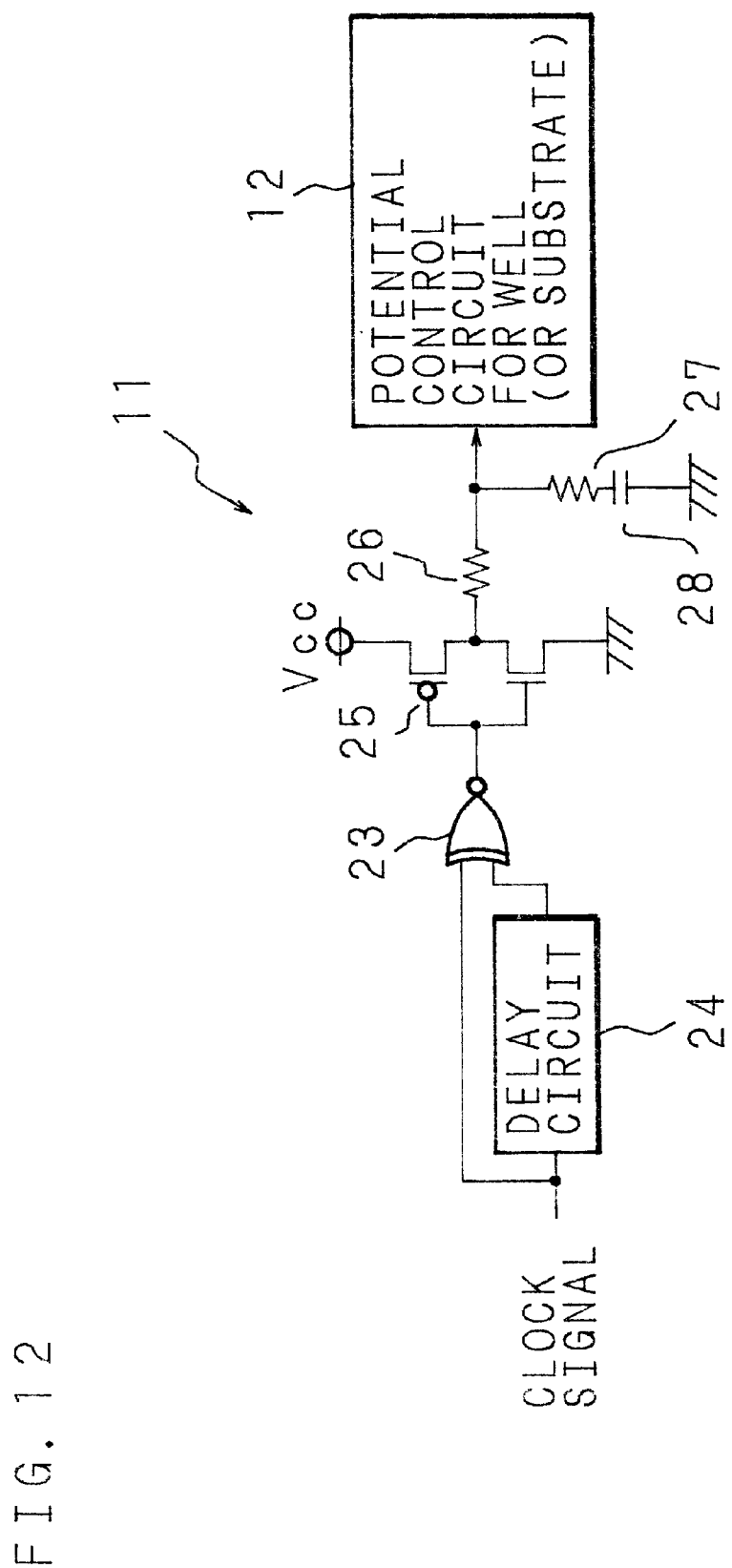
FIG. 12 is a circuit diagram illustrating the structure of the frequency detecting circuit shown in FIG. 11.

FIG. 12 is a circuit diagram illustrating the structure of the frequency detecting circuit 11. The potential control circuit 12 is substantially the same as the circuit shown in FIGS. 5A and 5B.

In FIG. 12 a clock signal is directly inputted to one of the input terminals of the EX-NOR circuit 23, and is inputted indirectly to the other input terminal through a delay circuit 24. The output of the EX-NOR circuit 23 is inputted to both gates of the P-channel MOS transistor and N-channel MOS transistor which constitute an inverter 25. The output terminal of the inverter 25 is connected to a potential control circuit 12 through a resistor 26, and is grounded through resistors 26, 27, and a capacitor 28.

Figure 13:
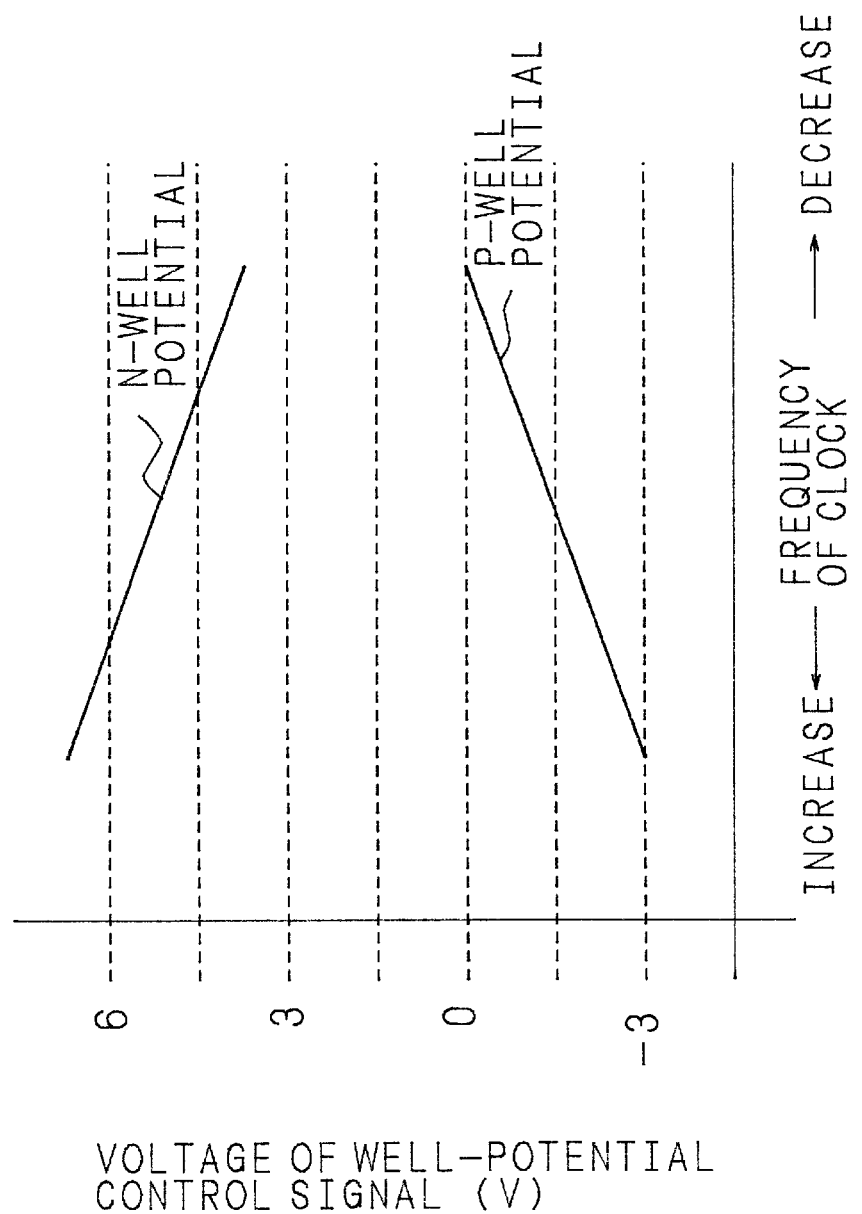
FIG. 13 is a graph showing the operating characteristics of the frequency detecting circuit shown in FIG. 12.

FIG. 13 is a graph showing the operating characteristics of the frequency detecting circuit 11 shown in FIG. 12 where the x-axis represents the frequencies of the clock and the y-axis represents voltage of well-potential control signals (voltage: V). As is evident from FIG. 13, a clock frequency and a well potential are substantially in a proportional relationship. The increase in the clock frequency causes the potential control circuit 12 to raise the N-well potential and to lower the P-well potential. As a result, the absolute values of the threshold voltages of the P-channel MOS transistor and N-channel MOS transistor having the N-well and P-well at the respective backgates are lowered, thereby raising the operation speed.

The decrease in the clock frequency causes the potential control circuit 12 to lower the N-well potential and to raise the P-well potential, thereby raising the absolute values of the threshold voltages of the two transistors, and controlling the rate of a current flowing through the transistors. Thus the consumption of electricity in each transistor is reduced.

In this way, Embodiment 2 can adjust the operating speed of the transistor, and the consumption of electricity to optimum values in accordance with the clock frequency.

Embodiment 3

This Embodiment is equipped with a PLL (Phase Locked Loop) circuit, and aims at adjusting the operating speed of the transistors and the consumption of electricity in accordance with the multiplication rates of the PLL circuit.

The PLL circuit itself is not new, and is used to adjust the phases by referring to a reference frequency signal so as to generate a clock.

More particularly, a phase detecting circuit is provided to compare the output of a frequency divider (which corresponds to a feedback signal of an output of the PLL circuit) with the reference frequency. If any delay is found in the output of the frequency divider, an up-signal is generated, and if an advancement is found, a down-signal is generated and outputted to a charge pump.

The charge pump adjusts a control voltage depending upon the up-signal or the down-signal, and outputs the adjusted control voltage to a voltage control type oscillator (VCO) through a filter. The voltage control type oscillator can adjust the oscillating frequency of an inverter ring with the control voltage, and outputs the adjusted oscillating frequency to a phase detecting circuit wherein a part of the oscillating frequency is divided by the frequency divider and returned to the phase detecting circuit.

Figure 14:
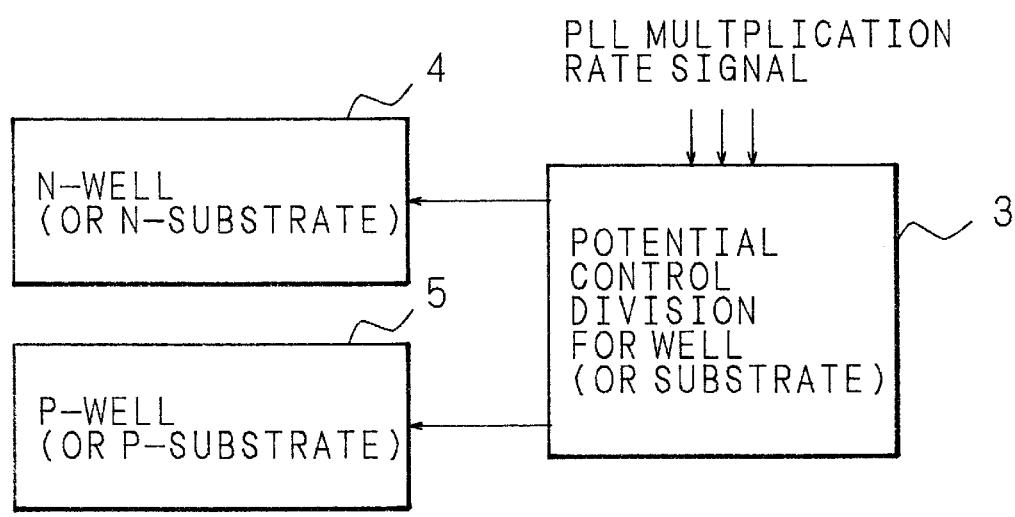
FIG. 14 is a block diagram illustrating the structure of Embodiment 3.

FIG. 14 is a block diagram illustrating the structure of Embodiment 3. The potential control division 3 is fed with a 3-bit PLL multiplication rate signal from the PLL circuit.

Figure 15:
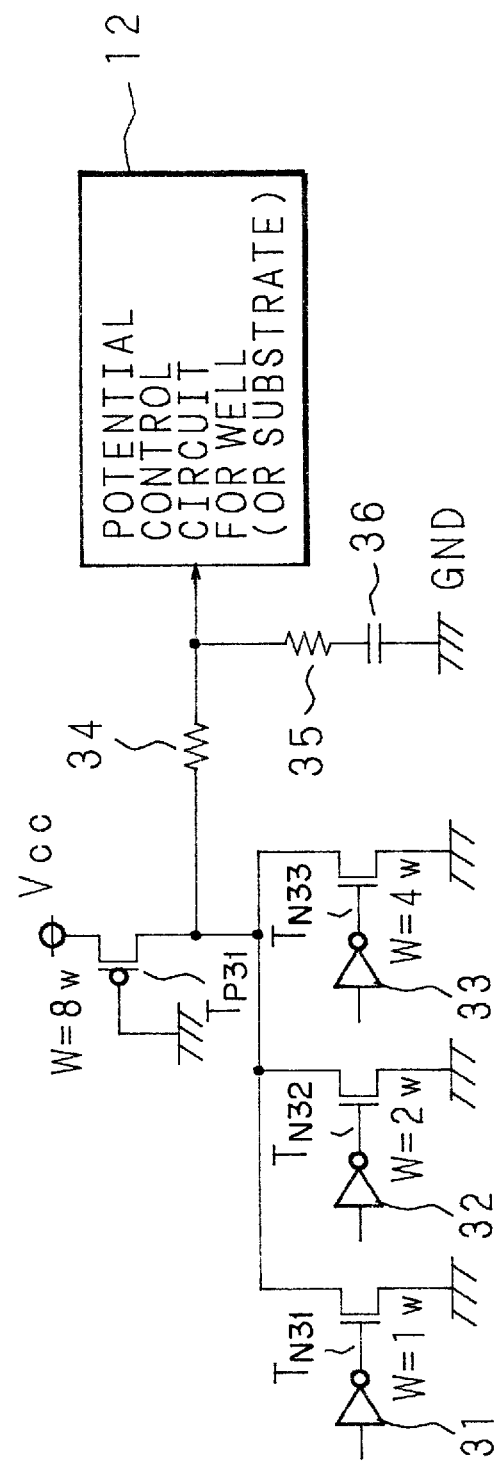
FIG. 15 is a circuit diagram illustrating the output circuit for the multiplication rate signal in the PLL circuit shown in FIG. 14.

FIG. 15 is a circuit diagram illustrating the structure of the output circuit for the PLL multiplication rate signal in the PLL circuit. The three drains of the parallel N-channel MOS transistors, Tn31, Tn32, and Tn33, are connected to the drain of the P-channel transistor Tp31 whose source is connected to voltage Vcc drain-side junction of the P-channel MOS transistor Tp31 is connected to the potential control circuit 12 through a resistor 34, and is kept at the ground potential through resistors 34, 35 and a capacitor 36.

The source of each of the N-channel MOS transistors Tn31, Tn32, and Tn33 is kept at the ground potential. The gate of the P-channel MOS transistor Tp31 is kept at the ground potential, and the gate of each of the three N-channel MOS transistors Tn31, Tn32 and Tn33 is fed with a PLL multiplication rate signal (which is in 3-bits, and switchable in a range of 2 to 9 stages of multiplication rate) through inverters 31, 32, and 33.

The multiplication rates are previously determined such that the gate widths of the N-channel MOS transistors Tn32, Tn33 and P-channel MOS transistor Tp31 are respectively two times, four times and eight times that of the N-channel MOS transistor Tn31.

The gate of the N-channel MOS transistor Tn31 is fed with a low-order bit PLL multiplication rate signal, and that of the N-channel MOS transistor Tn33 is fed with a high-order bit PLL multiplication rate signal.

Figure 16:
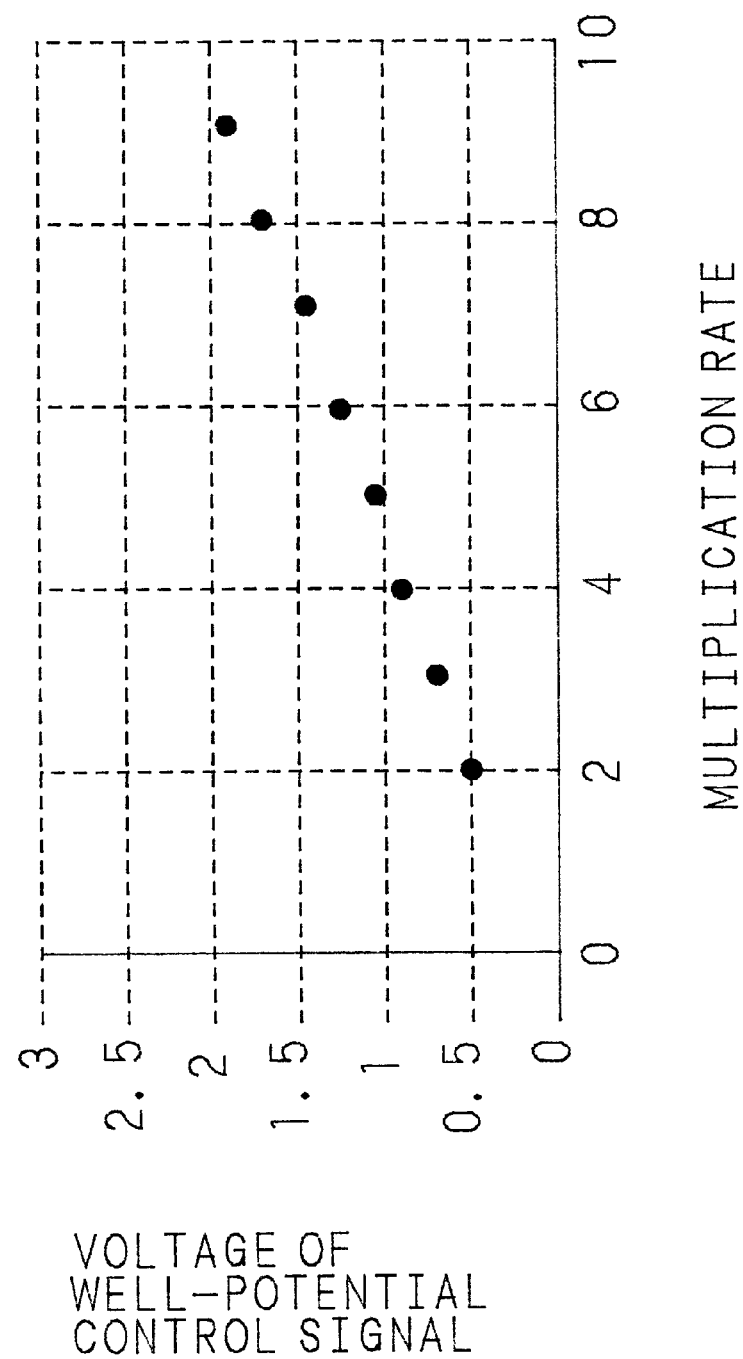
FIG. 16 is a graph showing the operating characteristics of the output circuit for the PLL multiplication rate signal in the circuit shown in FIG. 15.

FIG. 16 is a graph showing the operating characteristics of an output circuit for the PLL multiplication rate signal where the x-axis represents multiplication rates and the y-axis represents voltages of well-potential control signals.

FIG. 16 clearly shows that the PLL multiplication rate and the voltage of well-potential control signal are substantially in a proportional relationship; it will be understood that the larger the PLL multiplication rate becomes, the larger voltage a well-potential control signal has, thereby enabling the potential control circuit 12 to lower the N-well potential and to raise the P-well potential. As a result, the absolute values of the threshold voltages of the P-channel MOS transistor 1 and N-channel MOS transistor 2 having the N-well and P-well as backgates are lowered, thereby increasing the operating speed of the transistors.

When the PLL multiplication rate signal is small, the well-potential control signal has a low voltage, thereby raising the N-well potential, and lowering the P-well potential. As a result, the absolute values of the threshold voltage of the P-channel MOS transistor 1 and N-channel MOS transistor 2 are raised, thereby reducing the consumption of electricity in each of the transistors, and restraining the passing current and sub-threshold current.

In this way, Embodiment 3 makes it possible to adjust the operation speed of each transistor and the consumption of electricity to an optimum value in accordance with the PLL multiplication rate.

The operation of a MOSIC at a high multiplication rate enables each transistor to operate at a higher speed by lowering the absolute value of the threshold voltage thereof. The operation of it at a low multiplication rate reduces the consumption of electricity by raising the threshold voltage.

Embodiment 4

This embodiment is directed to ensure that when a plurality of source voltage values are set for a MOSIC, the operating speed of the transistor and the consumption of electricity can be adjusted in accordance with each of the set voltage values.

Figure 17:
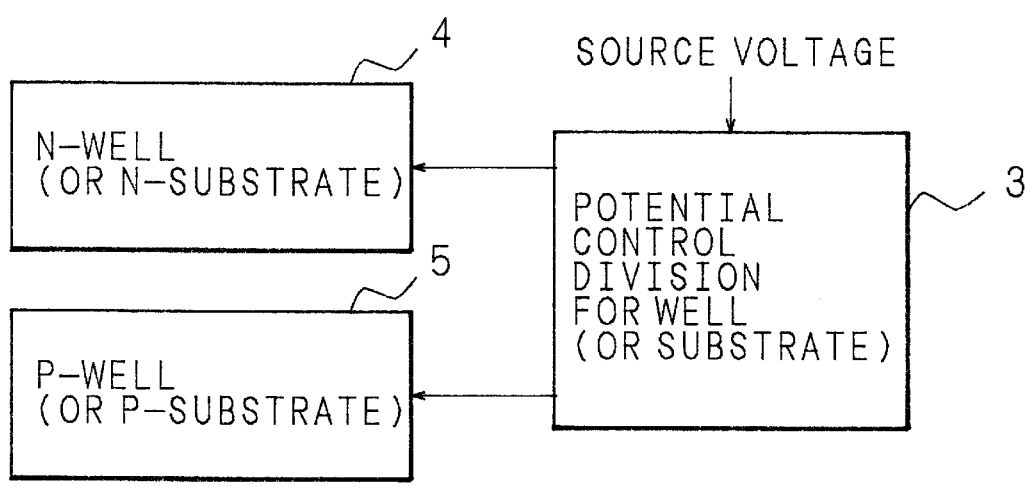
FIG. 17 is a block diagram illustrating the structure of Embodiment 4.

FIG. 17 is a block diagram illustrating the structure of Embodiment 4. The potential control division 3 controls the potential at the N-well 4 and at the P-well 5 in response to a predetermined source voltage from a variable source voltage circuit (not shown). The potential control division 3 is constructed in substantially the same manner as the circuit shown in FIGS. 5A and 5B and has substantially the same operating character as that shown in FIG. 6.

For example, when the maximum value of the variable source voltage is 3.0V, the gate of the P-channel MOS transistor Tp11 shown in FIG. 5A is delivered with 3V, and the source and well thereof are delivered with a source voltage of 6V, and the source and well of the P-channel MOS transistor Tp21 shown in FIG. 5B are delivered with 3.0V, and the source of the N-channel MOS transistor Tn21 is delivered with −3.0V as a constant source voltage respectively.

The gate of the P-channel MOS transistor Tp11 shown in FIG. 5B is delivered with a variable source voltage value VIN (3.0V), and the gate of the N-channel MOS transistor Tn14 shown in FIG. 5A is delivered with/VIN (0.3V, source voltage value).

In general, the higher a source voltage is, the higher the operating speed of a transistor and the larger the consumption of electricity become. The lower the source voltage is, the smaller the consumption of electricity becomes but the operating speed of the transistor is lowered. When the source voltage value is small, the potential control division 3 lowers the N-well potential, and raises the P-well. As a result, the absolute values of the threshold voltages of the P-channel MOS transistor and N-channel MOS transistor having the N-well and P-well as backgates, respectively are raised. When the source voltage value is large, the absolute values of the threshold voltages of the transistors are raised, thereby controlling a passing current and a sub-threshold current.

In this way, Embodiment 4 makes it possible to adjust the operating speed of each transistor and the consumption of electricity to optimum values in accordance with a source voltage value applied to the circuit in the MOSIC.

Embodiment 5

This embodiment is directed to ensure that the operating speed of the transistors in a specific circuit in the MOSIC and other circuits including the specific circuit, and the consumption of electricity are adjusted in accordance with the operation of the specific circuit in the MOSIC.

Figure 18:
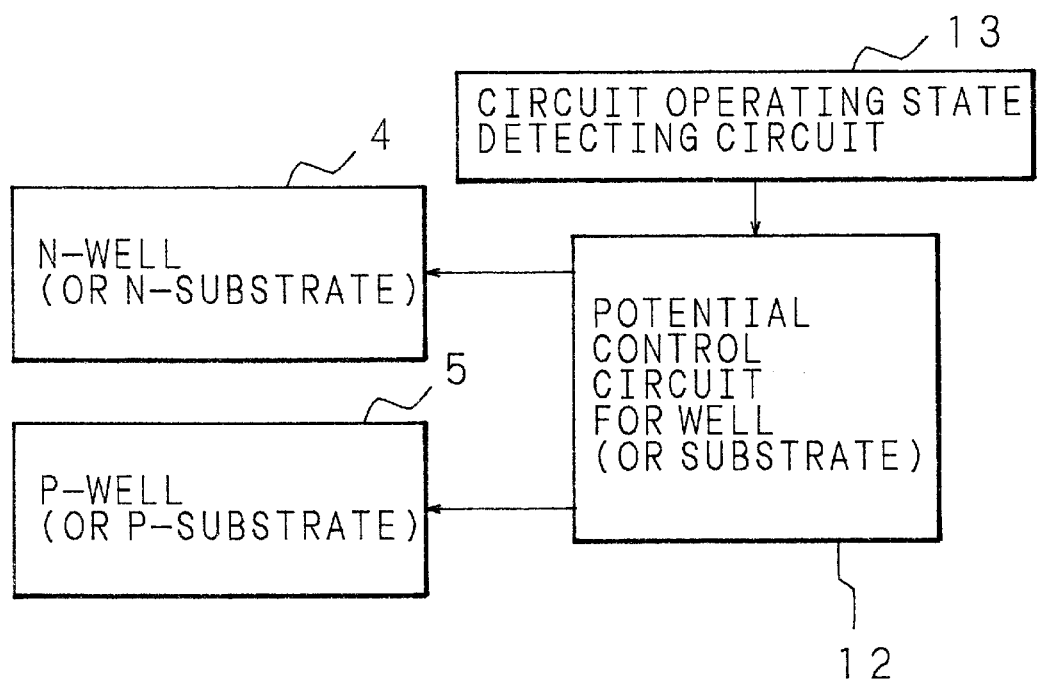
FIG. 18 is a block diagram illustrating the structure of Embodiment 5.

FIG. 18 is a block diagram illustrating the structure of Embodiment 5 in which the reference numeral 13 designates a circuit operating state detecting circuit. The circuit operating state detecting circuit 13 regards a specific circuit in the MOSIC as inoperative if no input or output occurs in this circuit within a predetermined period of time, and outputs an identification signal to a potential control circuit 12 so as to identify the operating state of the circuit. The potential control circuit 12 is structured in substantially the same manner as the circuits shown in FIGS. 5A and 5B.

When a specific circuit is identified as inoperative, the potential control circuit 12 lowers the N-well potential of the transistor including the particular circuit, and raises the P-well potential thereof. As a result, the absolute values of the threshold voltages of the P-channel MOS transistor and N-channel MOS transistor having the N-well and P-well as backgates are raised, thereby controlling the passing current and sub-threshold current passing through each transistor.

When the particular circuit is identified as operative, the absolute value of the threshold voltage is lowered, and the operating speed of the transistor is increased. Alternatively, it is possible to control the operating speed and consumption of electricity of every transistor including a circuit found inoperative by subdividing the circuit group to be controlled.

Embodiment 6

This embodiment is directed to ensure that the operating speed of the transistors in the MOSIC and the consumption of electricity are controlled in response to a control signal from outside the MOSIC.

Figure 19:
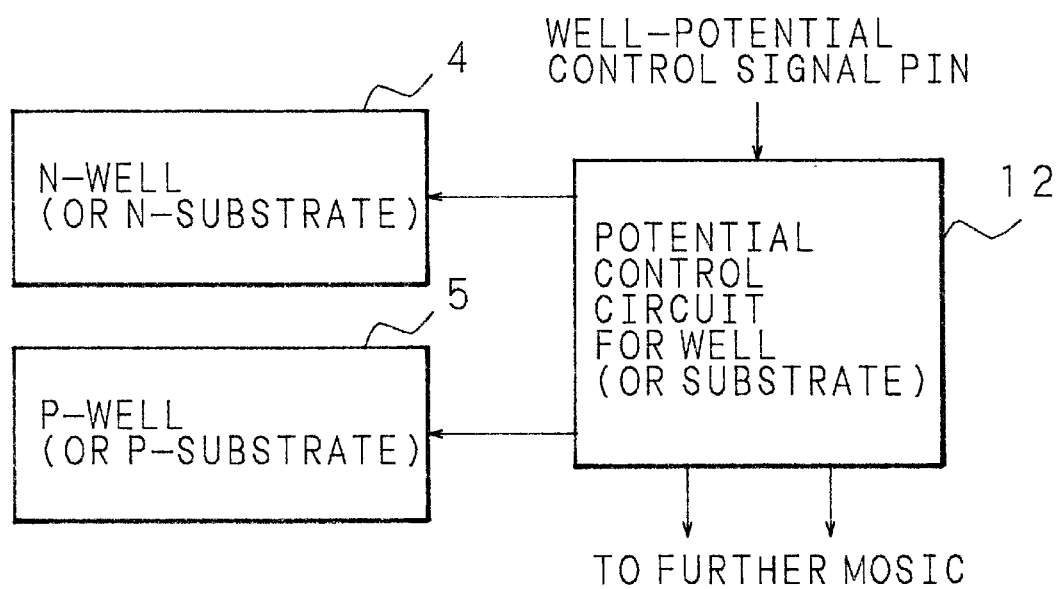
FIG. 19 is a block diagram illustrating the structure of Embodiment 6.

FIG. 19 is a block diagram illustrating the structure of Embodiment 6 in which the potential control circuit 12 receives a well-potential control signal from the outside through a pin (terminal).

The potential control circuit 12 is constructed substantially in the same manner as that shown in FIGS. 5A and 5B. Herein the PLL circuit shown in FIG. 15 or the variable source voltage circuit used in Embodiment 4 shown in FIG. 17 can be used as an output circuit for generating a well-potential control signal.

Embodiment 6 makes it possible to adjust such that the transistor in the MOSIC is operated at an optimum speed on a optimum consumption of electricity in response to the reception of a well-potential control signal from the outside the MOSIC. In addition, if the transistor has an unstable threshold voltage due to any failure occurring in the wafer process, the irregularity can be corrected by controlling the well potential from the outside.

In Embodiments 1 to 6 the potential of the well (or the substrate) of a transistor in a single MOSIC is adjusted but it is possible to adjust the well potential or substrate potential in a further MOSIC. In that case, as shown in FIG. 19, the potential control circuit 12 is provided with a terminal through which a signal is received from the outside so as to adjust the well (or substrate) potential of a circuit in the other MOSIC in accordance with the applied well-potential control signal. This is the same with Embodiments 1 to 5.

According to the present invention, the potential control circuit is provided so as to continuously or discontinuously change the potential of a well or substrate constituting a circuit, thereby effecting the subtle control of the operating characteristics of circuits or semiconductor devices and the consumption of electricity.

In addition, according to the present invention the potential control circuit can also continuously or discontinuously change the potential of a well or substrate in accordance with a clock frequency, a multiplication rate of an output of the PLL circuit or a plurality of source voltage values, thereby controlling the operating speed of the circuits or semiconductor devices, and the consumption of electricity in accordance with the operating state.

Furthermore, according to the present invention an identification circuit identifying the operating state of the circuit is provided to generate an identification signal whereby the well or substrate potential is continuously or separately controlled, thereby ensuring that the circuits or semiconductor devices are operated at an optimum speed on an optimum consumption of electricity depending upon the operating state of the circuits.

Furthermore, according to the present invention the well or substrate potential is continuously or discontinuously controlled in accordance with a voltage value of an external signal, thereby ensuring that the operating speed and consumption of electricity are adjusted on a simplified construction.

Furthermore, according to the present invention the potential control circuit can control the well or substrate potential of the circuit in an external MOSIC, thereby enabling a single potential control circuit to adjust the operating characteristics of the circuits in a plurality of MOSICs and consumption of electricity.

As this invention may be embodied in several forms without departing from the spirit of essential characteristics thereof, the present embodiments are therefore illustrative and not restrictive, since the scope of the invention is defined by the appended claims rather than by the description preceding them, and all changes that fall within metes and bounds of the claims, or equivalence of such metes and bounds thereof are therefore intended to be embraced by the claims.

What is claimed is:

1. A semiconductor integrated circuit comprising:
   at least one circuit performing a given function and including at least one transistor having a well; and
   a potential control circuit receiving an input signal from outside said potential control circuit and said at least one circuit, said potential control circuit varying the potential of said well of said at least one transistor to any of a multiplicity of potentials within a range of potentials between a saturation value and zero of said at least one transistor of said at least one circuit,
   wherein said potential of said well is controlled to be a potential within said range of potentials corresponding to an existing value of said input signal, wherein a line representing said correspondence between said potential of said well and said existing value of said input signal is a continuous line,
   wherein said input signal from outside said potential control circuit and said at least one circuit adjusts an operating speed of said at least one transistor to be one of any of a multiplicity of different speeds; and
   wherein the existing value of said input signal is related to a frequency, and the potential control circuit controls the well potential in accordance with the frequency.

2. The semiconductor integrated circuit according to claim 1,
   wherein the existing value of said input signal is related to a signal multiplication rate outputted from a PLL circuit, and the potential control circuit comprises:
   a first conductive MOS transistor whose gate is connected to a first source terminal, and whose source and well are connected to a second source terminal;
   a primary second conductive MOS transistor whose gate is connected to a drain of the first conductive MOS transistor, whose drain is connected to the drain of the first conductive MOS transistor, for providing an N well control signal;
   a secondary second conductive MOS transistor whose gate and drain are connected to a source of the primary second conductive MOS transistor;
   a tertiary second conductive MOS transistor whose gate is connected to the first source terminal, and whose drain is connected to a source of the secondary second conductive MOS transistor; and
   a quaternary second conductive MOS transistor whose gate is connected to an input terminal for receiving a reversing control signal, whose drain is connected to a source of the tertiary second conductive MOS transistor, and whose source is connected to a ground terminal.

3. The semiconductor integrated circuit according to claim 1, further comprising:
   an identification circuit for identifying the operational or non-operational state of at least part of the semiconductor integrated circuit,
   wherein the existing value of said input signal is an identification signal from the identification circuit, and
   wherein the potential control circuit comprises:
   a first conductive MOS transistor whose gate is connected to a first source terminal, and whose source and well are connected to a second source terminal;
   a primary second conductive MOS transistor whose gate is connected to a drain of the first conductive MOS transistor, whose drain is connected to the drain of the first conductive MOS transistor, for providing an N well control signal;
   a secondary second conductive MOS transistor whose gate and drain are connected to a source of the primary second conductive MOS transistor;
   a tertiary second conductive MOS transistor whose gate is connected to the first source terminal, and whose drain is connected to a source of the secondary second conductive MOS transistor; and
   a quaternary second conductive MOS transistor whose gate is connected to an input terminal for receiving a reversing control signal, whose drain is connected to a source of the tertiary second conductive MOS transistor, and whose source is connected to a ground terminal.

4. The semiconductor integrated circuit according to claim 1, wherein the potential control circuit comprises;
   a first conductive MOS transistor whose gate is connected to a first source terminal, and whose source and well are connected to a second source terminal;
   a primary second conductive MOS transistor whose gate is connected to a drain of the first conductive MOS transistor, whose drain is connected to the drain of the first conductive MOS transistor, for providing an N well control signal;
   a secondary second conductive MOS transistor whose gate and drain are connected to a source of the primary second conductive MOS transistor;
   a tertiary second conductive MOS transistor whose gate is connected to the first source terminal, and whose drain is connected to a source of the secondary second conductive MOS transistor; and a quaternary second conductive MOS transistor whose gate is connected to an input terminal for receiving a reversing control signal, whose drain is connected to a source of the tertiary second conductive MOS transistor, and whose source is connected to a ground terminal.

5. The semiconductor integrated circuit according to claim 1, wherein the potential control circuit comprises;

a second conductive MOS transistor whose gate is connected to a ground terminal, and whose source and well are connected to a first negative source terminal;

a quaternary first conductive MOS transistor whose gate is connected to a drain of the second conductive MOS transistor, whose drain is connected to the drain of the second conductive MOS transistor, for providing a p well control signal;

a tertiary first conductive MOS transistor whose gate and drain are connected to a source of the quaternary first conductive MOS transistor;

a secondary first conductive MOS transistor whose gate is connected to the ground terminal, and whose drain is connected to a source of the tertiary first conductive MOS transistor; and a primary first conductive MOS transistor whose gate is connected to an input terminal for receiving a control signal, whose drain is connected to a source of the secondary first conductive MOS transistor, and whose source is connected to a first source terminal.

6. The semiconductor integrated circuit according to claim 1, wherein the existing value of said input signal is related to a signal multiplication rate outputted from a PLL circuit, and the potential control circuit comprises;

a second conductive MOS transistor whose gate is connected to a ground terminal, and whose source and well are connected to a first negative source terminal;

a quaternary first conductive MOS transistor whose gate is connected to a drain of the second conductive MOS transistor, whose drain is connected to the drain of the second conductive MOS transistor, for providing a p well control signal;

a tertiary first conductive MOS transistor whose gate and drain are connected to a source of the quaternary first conductive MOS transistor;

a secondary first conductive MOS transistor whose gate is connected to the ground terminal, and whose drain is connected to a source of the tertiary first conductive MOS transistor; and a primary first conductive MOS transistor whose gate is connected to an input terminal for receiving a control signal, whose drain is connected to a source of the secondary first conductive MOS transistor, and whose source is connected to a first source terminal.

7. The semiconductor integrated circuit according to claim 1, further comprising:

an identification circuit for identifying the operational or non-operational state of at least part of the semiconductor integrated circuit, wherein the existing value of said input signal is an identification signal from the identification circuit, and wherein the potential control circuit comprises:

a second conductive MOS transistor whose gate is connected to a ground terminal, and whose source and well are connected to a first negative source terminal;

a quaternary first conductive MOS transistor whose gate is connected to a drain of the second conductive MOS transistor, whose drain is connected to the drain of the second conductive MOS transistor, for providing a p well control signal;

a tertiary first conductive MOS transistor whose gate and drain are connected to a source of the quaternary first conductive MOS transistor;

a secondary first conductive MOS transistor whose gate is connected to the ground terminal, and whose drain is connected to a source of the tertiary first conductive MOS transistor; and a primary first conductive MOS transistor whose gate is connected to an input terminal for receiving a control signal, whose drain is connected to a source of the secondary first conductive MOS transistor, and whose source is connected to a first source terminal.

8. A semiconductor integrated circuit comprising:

at least one circuit performing a given function and including at least one transistor on a substrate; and a potential control circuit receiving an input signal from outside said potential control circuit and said at least one circuit, said potential control circuit varying the potential of said substrate of said at least one transistor to any of a multiplicity of potentials within a range of potentials between a saturation value and zero of said at least one transistor of said at least one circuit, wherein said potential of said substrate is controlled to be a potential within said range of potentials corresponding to an existing value of said input signal, wherein a line representing said correspondence between said potential of said substrate and said existing value of said input signal is a continuous line, wherein said input signal from outside said potential control circuit and said at least one circuit adjusts an operating speed of said at least one transistor to be one of any of a multiplicity of different speeds, wherein the existing value of said input signal is related to a frequency, and wherein the potential control circuit controls the substrate potential in accordance with the frequency.

9. The semiconductor integrated circuit according to claim 8, wherein the existing value of said input signal is related to a signal multiplication rate outputted from a PLL circuit, and wherein the potential control circuit comprises:

a first conductive MOS transistor whose gate is connected to a first source terminal, and whose source and well are connected to a second source terminal;

a primary second conductive MOS transistor whose gate is connected to a drain of the first conductive MOS transistor, whose drain is connected to the drain of the first conductive MOS transistor, for providing an N well control signal;

a secondary second conductive MOS transistor whose gate and drain are connected to a source of the primary second conductive MOS transistor;

a tertiary second conductive MOS transistor whose gate is connected to the first source terminal, and whose drain is connected to a source of the secondary second conductive MOS transistor; and a quaternary second conductive MOS transistor whose gate is connected to an input terminal for receiving a reversing control signal, whose drain is connected to a source of the tertiary second conductive MOS transistor, and whose source is connected to a ground terminal.

10. The semiconductor integrated circuit according to claim 8, further comprising:

an identification circuit for identifying the operational or non-operational state of at least part of the semiconductor integrated circuit, wherein the existing value of said input signal is an identification signal from the identification circuit, and wherein the potential control circuit comprises:
  a first conductive MOS transistor whose gate is connected to a first source terminal, and whose source and well are connected to a second source terminal;
  a primary second conductive MOS transistor whose gate is connected to a drain of the first conductive MOS transistor, whose drain is connected to the drain of the first conductive MOS transistor, for providing an N well control signal;
  a secondary second conductive MOS transistor whose gate and drain are connected to a source of the primary second conductive MOS transistor;
  a tertiary second conductive MOS transistor whose gate is connected to the first source terminal, and whose drain is connected to a source of the secondary second conductive MOS transistor; and
  a quaternary second conductive MOS transistor whose gate is connected to an input terminal for receiving a reversing control signal, whose drain is connected to a source of the tertiary second conductive MOS transistor, and whose source is connected to a ground terminal.

11. The semiconductor integrated circuit according to claim 8, wherein the existing value of said input signal is related to a signal multiplication rate outputted from a PLL circuit, and wherein the potential control circuit comprises:
  a second conductive MOS transistor whose gate is connected to a ground terminal, and whose source and well are connected to a first negative source terminal;
  a quaternary first conductive MOS transistor whose gate is connected to a drain of the second conductive MOS transistor, whose drain is connected to the drain of the second conductive MOS transistor, for providing a p well control signal;
  a tertiary first conductive MOS transistor whose gate and drain are connected to a source of the quaternary first conductive MOS transistor;
  a secondary first conductive MOS transistor whose gate is connected to the ground terminal, and whose drain is connected to a source of the tertiary first conductive MOS transistor; and
  a primary first conductive MOS transistor whose gate is connected to an input terminal for receiving a control signal, whose drain is connected to a source of the secondary first conductive MOS transistor, and whose source is connected to a first source terminal.

12. The semiconductor integrated circuit according to claim 8, further comprising:

an identification circuit for identifying the operational or non-operational state of at least part of the semiconductor integrated circuit, wherein the existing value of said input signal is an identification signal from the identification circuit, and wherein the potential control circuit comprises:
  a second conductive MOS transistor whose gate is connected to a ground terminal, and whose source and well are connected to a first negative source terminal;
  a quaternary first conductive MOS transistor whose gate is connected to a drain of the second conductive MOS transistor, whose drain is connected to the drain of the second conductive MOS transistor, for providing a p well control signal;
  a tertiary first conductive MOS transistor whose gate and drain are connected to a source of the quaternary first conductive MOS transistor;
  a secondary first conductive MOS transistor whose gate is connected to the ground terminal, and whose drain is connected to a source of the tertiary first conductive MOS transistor; and
  a primary first conductive MOS transistor whose gate is connected to an input terminal for receiving a control signal, whose drain is connected to a source of the secondary first conductive MOS transistor, and whose source is connected to a first source terminal.

13. A semiconductor integrated circuit comprising:

at least one circuit performing a given function and including at least two transistors each having a well; and a potential control circuit receiving an input signal from outside said potential control circuit and said at least one circuit, said potential control circuit separately and independently varying the potential of said respective wells of said at least two transistors to any of a multiplicity of potentials within a range of potentials between a saturation value and zero of said at least two transistors of said at least one circuit, wherein said potential of said wells are individually and separately controlled to be a potential within said range of potentials corresponding to an existing value of said input signal, wherein a line representing said correspondence between said potential of each of said wells and said existing value of said input signal is a continuous line, and wherein said input signal from outside said potential control circuit and said at least one circuit adjusts an operating speed of said at least two transistors to be one of any of a multiplicity of different speeds.

* * * * *